United States Patent
Yoshida

(10) Patent No.: US 11,764,304 B2
(45) Date of Patent: Sep. 19, 2023

(54) SEMICONDUCTOR DEVICE AND METHOD OF MANUFACTURING THE SAME

(71) Applicant: Powerchip Semiconductor Manufacturing Corporation, Hsinchu (TW)

(72) Inventor: Hiroshi Yoshida, Hsinchu (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 48 days.

(21) Appl. No.: 17/386,565

(22) Filed: Jul. 28, 2021

(65) Prior Publication Data
US 2023/0034575 A1 Feb. 2, 2023

(51) Int. Cl.
- *H01L 29/786* (2006.01)
- *H01L 29/66* (2006.01)
- *H01L 21/02* (2006.01)
- *H01L 29/24* (2006.01)

(52) U.S. Cl.
CPC .... *H01L 29/7869* (2013.01); *H01L 21/02565* (2013.01); *H01L 29/24* (2013.01); *H01L 29/66969* (2013.01)

(58) Field of Classification Search
CPC .......... H01L 29/7869; H01L 29/66969; H01L 21/02565
See application file for complete search history.

(56) References Cited

U.S. PATENT DOCUMENTS

| | | | |
|---|---|---|---|
| 9,159,837 B2 | 10/2015 | Yamazaki et al. | |
| 9,780,100 B1* | 10/2017 | Balakrishnan | H10B 43/27 |
| 11,094,669 B2* | 8/2021 | Hu | H01L 24/11 |
| 2010/0210098 A1* | 8/2010 | Faltermeier | H01L 21/76897 438/586 |
| 2011/0121284 A1* | 5/2011 | Yamazaki | H01L 29/78606 257/43 |

(Continued)

FOREIGN PATENT DOCUMENTS

WO 2018111247 6/2018

OTHER PUBLICATIONS

D.-L. Kwong et al., "Vertical Silicon Nanowire Platform for Low Power Electronics and Clean Energy Applications", Journal of Nanotechnology, Jan. 2012, pp. 1-23.

(Continued)

*Primary Examiner* — Vincent Wall
(74) *Attorney, Agent, or Firm* — JCIPRNET

(57) ABSTRACT

A semiconductor device and a method of manufacturing the same are provided. The semiconductor device includes a substrate, a first electrode layer disposed on the substrate, a gate electrode layer disposed on the first electrode layer, a second electrode layer disposed on the gate electrode layer, an oxide semiconductor layer penetrating through the gate electrode layer, a gate dielectric layer disposed between the gate electrode layer and the oxide semiconductor layer, a first insulating layer disposed between the gate electrode layer and the first electrode layer, and a second insulating layer disposed between the gate electrode layer and the second electrode layer. The oxide semiconductor layer is in direct contact with the first electrode layer and the second electrode layer, respectively.

4 Claims, 7 Drawing Sheets

(56) References Cited

U.S. PATENT DOCUMENTS

| | | | |
|---|---|---|---|
| 2011/0121288 A1* | 5/2011 | Yamazaki | H01L 29/78642 |
| | | | 257/43 |
| 2014/0124728 A1* | 5/2014 | Kim | H10B 63/80 |
| | | | 438/238 |
| 2017/0077230 A1* | 3/2017 | Ikeda | H01L 29/78696 |
| 2019/0148509 A1 | 5/2019 | Cheng et al. | |
| 2020/0058798 A1* | 2/2020 | Pillarisetty | H01L 29/4232 |
| 2020/0395467 A1 | 12/2020 | Yu et al. | |
| 2021/0013314 A1* | 1/2021 | Hu | H01L 29/7827 |
| 2021/0159243 A1* | 5/2021 | Hu | H10B 43/10 |
| 2021/0375990 A1* | 12/2021 | Young | H10B 63/34 |
| 2021/0376157 A1* | 12/2021 | Doornbos | H01L 29/0673 |
| 2021/0398994 A1* | 12/2021 | Young | H01L 29/40111 |
| 2023/0034575 A1* | 2/2023 | Yoshida | H01L 29/24 |

OTHER PUBLICATIONS

"Office Action of Taiwan Counterpart Application", dated Sep. 7, 2022, p. 1-p. 7.

\* cited by examiner

SEMICONDUCTOR DEVICE AND METHOD OF MANUFACTURING THE SAME

BACKGROUND

Technical Field

The invention relates to a semiconductor manufacture technique, and particularly relates to a semiconductor device and a method of manufacturing the same.

Description of Related Art

The semiconductor device such as transistor has been developed for a long time. The transistor includes plane device and vertical device. The plane device is, for example, a thin film transistor, wherein a source electrode and a drain electrode are over a gate electrode, and the channel length (Lg) is defined by the spacing between the source electrode and the drain electrode. However, the channel length is desired to be smaller with the miniaturization of the device size, and thus the Lg of the plane device can not meet the requirement due to the resolution limitation of photolithography.

The vertical device is, for example, a 3D transistor, wherein a vertical channel formed on the substrate, a source electrode and a drain electrode are disposed at two ends of the vertical channel, and the Lg of the vertical device is defined by the thickness of a gate electrode. Therefore, the Lg of vertical device can be made smaller. However, the process of the vertical device is more complicated than the plane device, and it is difficult in the formation and the contact for drain/source/body.

SUMMARY

The invention provides a semiconductor device having fine channel length without complicated process.

The invention further provides a method of manufacturing a semiconductor device to obtain the semiconductor device having fine channel length.

The semiconductor device of one embodiment of the invention includes a substrate, a first electrode layer, a gate electrode layer, a second electrode layer, an oxide semiconductor layer, a gate dielectric layer, a first insulating layer, and a second insulating layer. The first electrode layer is disposed on the substrate, the gate electrode layer is disposed on the first electrode layer, and the second electrode layer is disposed on the gate electrode layer, wherein the first electrode layer and the second electrode layer are as a drain and a source of the semiconductor device. The oxide semiconductor layer penetrates through the gate electrode layer and is in direct contact with the first electrode layer and the second electrode layer, respectively. The gate dielectric layer is disposed between the gate electrode layer and the oxide semiconductor layer, the first insulating layer is disposed between the gate electrode layer and the first electrode layer, and the second insulating layer is disposed between the gate electrode layer and the second electrode layer.

In an embodiment of the invention, the semiconductor device further comprises electrode contacts connecting to the first electrode layer, the gate electrode layer, and the second electrode layer, respectively.

In an embodiment of the invention, a material of the oxide semiconductor layer comprises indium-gallium-zinc oxide (IGZO).

In an embodiment of the invention, the substrate comprises a silicon-on-insulator (SOI) substrate.

The method of manufacturing a semiconductor device of another embodiment of the invention includes forming a first electrode layer on a substrate, and then forming a stack structure on the first electrode layer, wherein the stack structure comprises a first insulating layer, a gate electrode layer, and a second insulating layer. An opening is formed in the stack structure. A gate dielectric layer is formed on a sidewall of the opening of the stack structure, and an oxide semiconductor layer is formed in the opening, wherein the gate dielectric layer is sandwiched between the oxide semiconductor layer and the gate electrode layer. A second electrode layer is then formed on the stack structure to be in direct contact with the oxide semiconductor layer.

In another embodiment of the invention, after the step of forming the second electrode layer, the method further comprises patterning the second insulating layer and the gate electrode layer.

In another embodiment of the invention, after the step of forming the second electrode layer, the method further comprises respectively forming electrode contacts connecting to the first electrode layer, the gate electrode layer, and the second electrode layer.

In another embodiment of the invention, the step of forming the gate dielectric layer comprises conformally depositing a dielectric material layer on the stack structure and in the opening, and then etching back the dielectric material layer until the first electrode layer is exposed.

In another embodiment of the invention, the step of forming the stack structure comprises depositing the first insulating layer on the first electrode layer, depositing the gate electrode layer on the first insulating layer, and depositing the second insulating layer on the gate electrode layer.

In another embodiment of the invention, the step of forming the oxide semiconductor layer in the opening comprises blanket depositing an oxide semiconductor material to fill the opening, and then etching back the oxide semiconductor material until the stack structure is exposed.

In another embodiment of the invention, a method of forming the oxide semiconductor layer in the opening comprises a selective deposition process.

In another embodiment of the invention, a material of the oxide semiconductor layer comprises indium-gallium-zinc oxide.

In another embodiment of the invention, the substrate comprises a silicon-on-insulator (SOI) substrate.

Based on the above, since the invention provides a semiconductor device having a planar stack structure containing two source/drain electrodes, a gate electrode layer therebetween, and an oxide semiconductor penetrating through the gate electrode layer, it can realize fine channel length in the semiconductor device by simple process.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
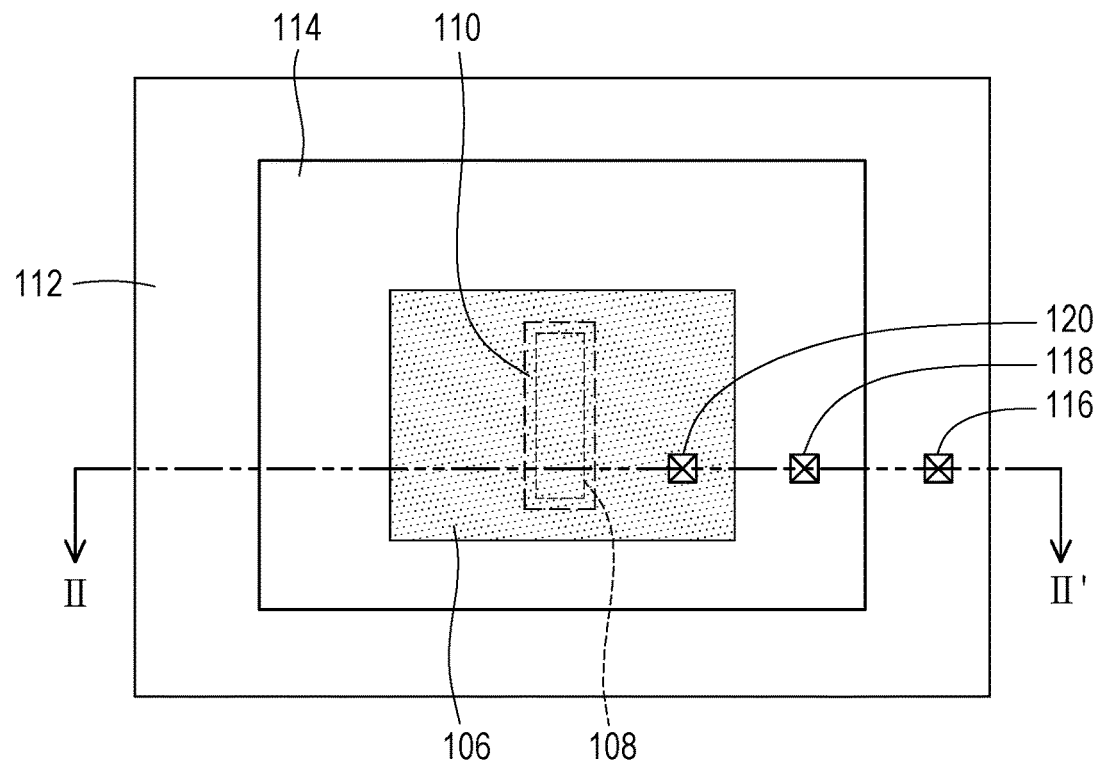
FIG. 1 is a schematic plan view of a semiconductor device according to a first embodiment of the invention.

Referring to the embodiments below and the accompanied drawings for a sufficient understanding of the invention. These embodiments are described in sufficient detail to enable those skilled in the art to practice the invention. However, the invention may be implemented in many other different forms and should not be limited to the embodiments described hereinafter. Other embodiments may be utilized and structural, logical, and electrical changes may be made without departing from the scope of the present invention. In the drawings, for clarity, the elements and relative dimensions thereof may not be scaled. For easy understanding, the same elements in the following embodiments will be denoted by the same reference numerals.

Figure 2:
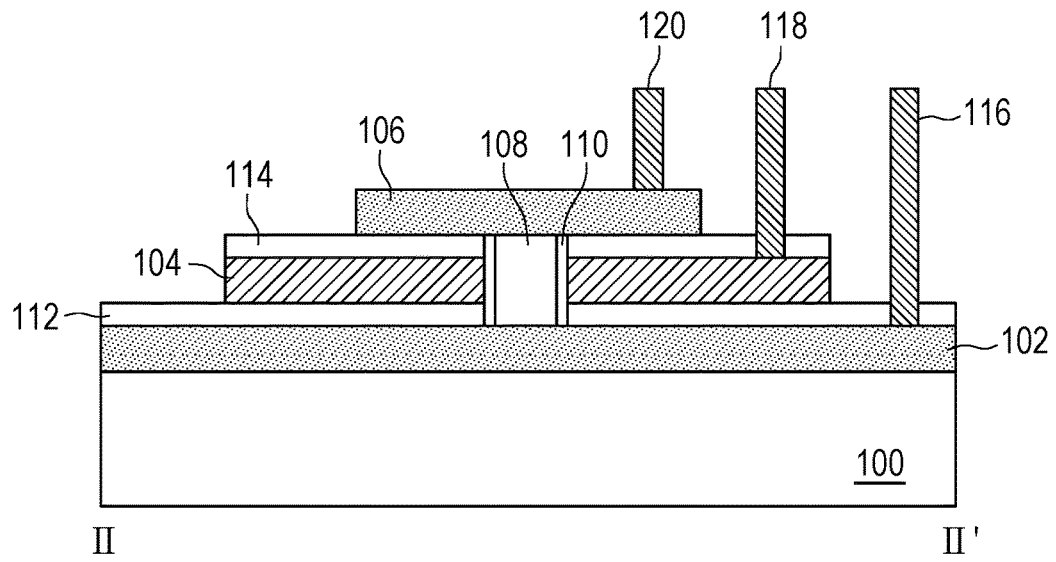
FIG. 2 is a cross-sectional view along line II-II' of FIG. 1.

FIG. 1 is a schematic plan view of a semiconductor device according to a first embodiment of the invention. FIG. 2 is a cross-sectional view along line II-II' of FIG. 1.

Referring to FIG. 1 and FIG. 2, the semiconductor device of the first embodiment includes a substrate 100, a first electrode layer 102, a gate electrode layer 104, a second electrode layer 106, an oxide semiconductor layer 108, a gate dielectric layer 110, a first insulating layer 112, and a second insulating layer 114. The first electrode layer 102 is disposed on the substrate 100, the gate electrode layer 104 is disposed on the first electrode layer 102, and the second electrode layer 106 is disposed on the gate electrode layer 104. In one embodiment, the substrate 100 may be a silicon-on-insulator (SOI) substrate or other semiconductor substrate. The gate electrode layer 104 may be made of conductive material such as indium oxide-tin oxide, indium oxide containing tungsten oxide, indium zinc oxide containing tungsten oxide, indium oxide containing titanium oxide, indium tin oxide containing titanium oxide, indium oxide, zinc oxide, or other suitable material. The first electrode layer 102 and the second electrode layer 106 are as a drain and a source of the semiconductor device. For example, the first electrode layer 102 is a drain electrode and the second electrode layer 106 is a source electrode; alternatively, the first electrode layer 102 is a source electrode and the second electrode layer 106 is a drain electrode. In one embodiment, the first electrode layer 102 and the second electrode layer 106 may be a metal film or a metal nitride film, wherein the material of the metal film is selected from Al, Cr, Cu, Ta, Ti, Mo, and W; the material of the metal nitride film is nitride of foregoing metal such as a titanium nitride film, a molybdenum nitride film, a tungsten nitride film), or the like. The oxide semiconductor layer 108 penetrates through the gate electrode layer 104 and is in direct contact with the first electrode layer 102 and the second electrode layer 106, respectively. A material of the oxide semiconductor layer 108 includes, for example, indium-gallium-zinc oxide (IGZO) or other suitable oxide semiconductor material. The gate dielectric layer 110 is disposed between the gate electrode layer 104 and the oxide semiconductor layer 108, the first insulating layer 112 is disposed between the gate electrode layer 104 and the first electrode layer 102, and the second insulating layer 114 is disposed between the gate electrode layer 104 and the second electrode layer 106.

In the first embodiment, the profile of the cross section of the semiconductor device is step-shaped, and thus it is beneficial to interconnection of the semiconductor device. For example, an electrode contact 116 connects to the first electrode layer 102, an electrode contact 118 connects to the gate electrode layer 104, and an electrode contact 120 connects to the second electrode layer 106. Those electrode contacts 116, 118 and 120 can be formed together using the same steps. However, the invention is not limited thereto.

Figure 3:
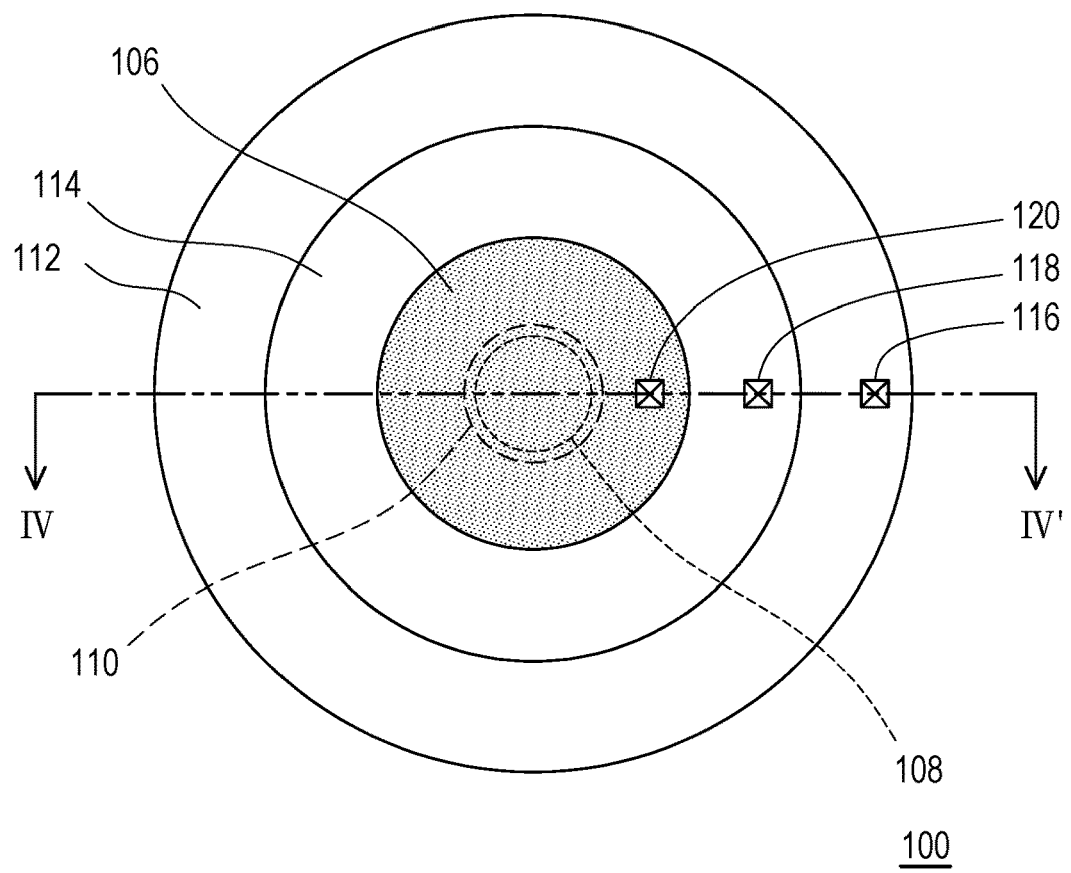
FIG. 3 is a schematic plan view of a semiconductor device according to a second embodiment of the invention.
Figure 4:
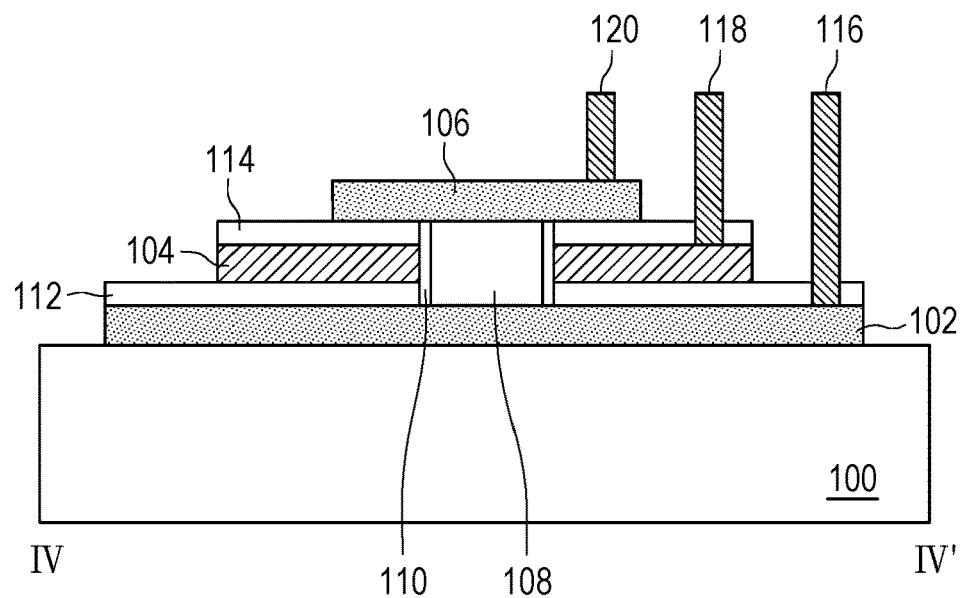
FIG. 4 is a cross-sectional view along line IV-IV' of FIG. 3.

FIG. 3 is a schematic plan view of a semiconductor device according to a second embodiment of the invention, wherein the reference symbols used in the first embodiment are used to equally represent the same or similar components. FIG. 4 is a cross-sectional view along line IV-IV' of FIG. 3. The description of the same components can be derived from the first embodiment, and will not be repeated here.

Referring to FIG. 3 and FIG. 4, the semiconductor device of the second embodiment also includes a substrate 100, a first electrode layer 102, a gate electrode layer 104, a second electrode layer 106, an oxide semiconductor layer 108, a gate dielectric layer 110, a first insulating layer 112, and a second insulating layer 114. The difference between the second and the first embodiments is that the shapes of the oxide semiconductor layer 108 and the second electrode layer 106 are circular. In another embodiment, the shapes of the oxide semiconductor layer 108 and the second electrode layer 106 in the FIG. 3 may be rectangle, and so on.

FIG. 5A to FIG. 5I are schematic cross-sectional views of a manufacturing process of a semiconductor device according to a third embodiment of the invention.

Figure 5A:
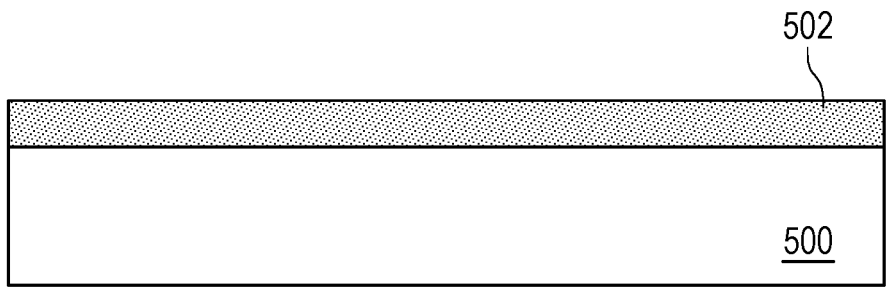
FIG. 5A to FIG. 5I are schematic cross-sectional views of a manufacturing process of a semiconductor device according to a third embodiment of the invention.

Referring to FIG. 5A, a first electrode layer 502 is formed on a substrate 500. The substrate 500 may be a SOI substrate or other semiconductor substrate.

Figure 5B:
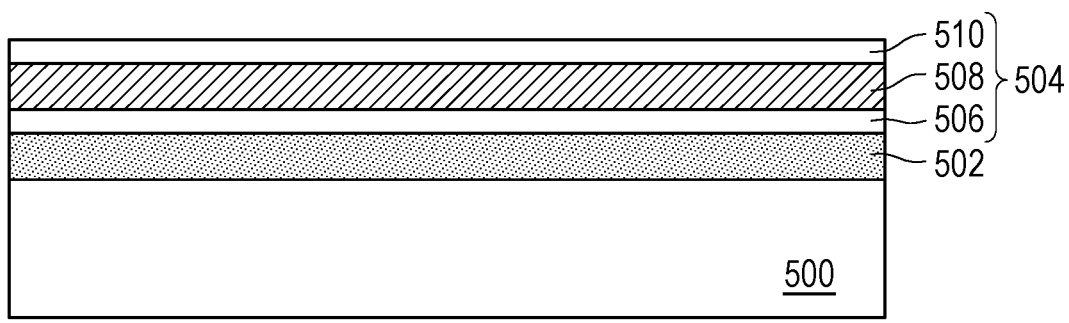

Then, referring to FIG. 5B, a stack structure 504 is formed on the first electrode layer 502, wherein the stack structure 504, for example, includes a first insulating layer 506, a gate electrode layer 508, and a second insulating layer 510. In the embodiment, the step of forming the stack structure 504, for example, includes depositing the first insulating layer 506 on the first electrode layer 502, depositing the gate electrode layer 508 on the first insulating layer 506, and depositing the second insulating layer 510 on the gate electrode layer 508.

Figure 5C:
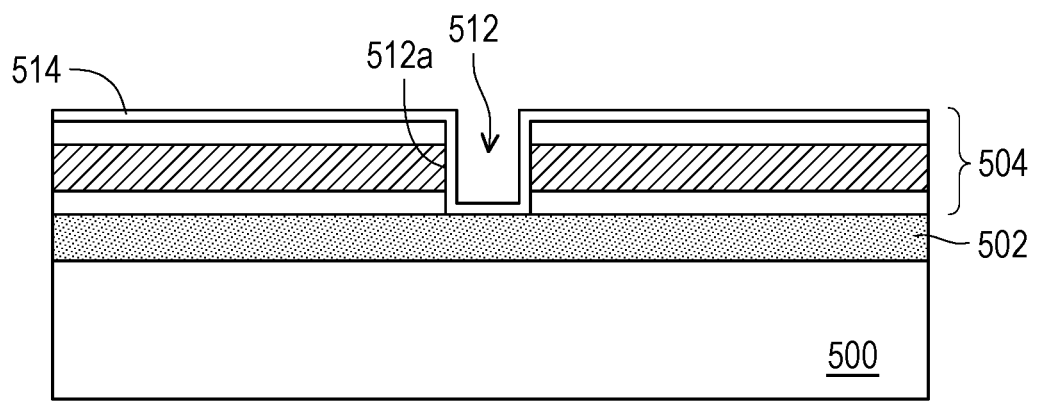

Thereafter, referring to FIG. 5C, an opening 512 is formed in the stack structure 504. The opening 512 may be, for example, a rectangle groove or a circular hole. To form a gate dielectric layer on a sidewall 512a of the opening 512, it may conformally depositing a dielectric material layer 514 on the stack structure 504 and in the opening 512 first.

Figure 5D:
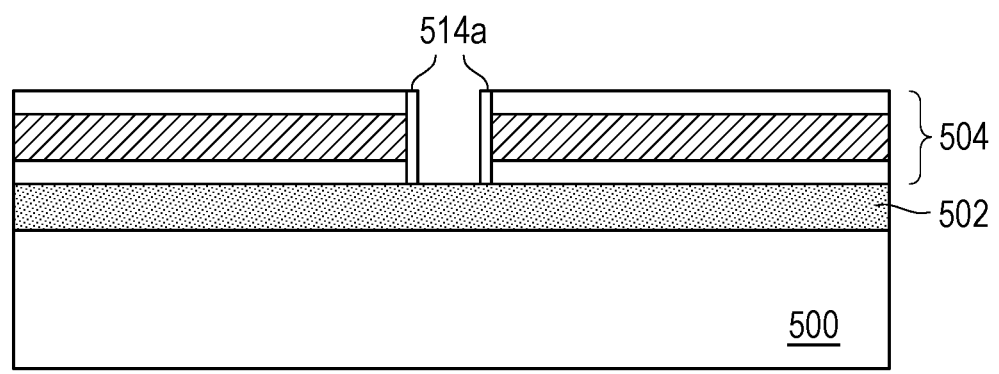

After that, referring to FIG. 5D, the dielectric material layer 514 in FIG. 5C is etched back until the first electrode layer 502 is exposed so as to form the gate dielectric layer 514a. However, the invention is not limited thereto.

Figure 5E:
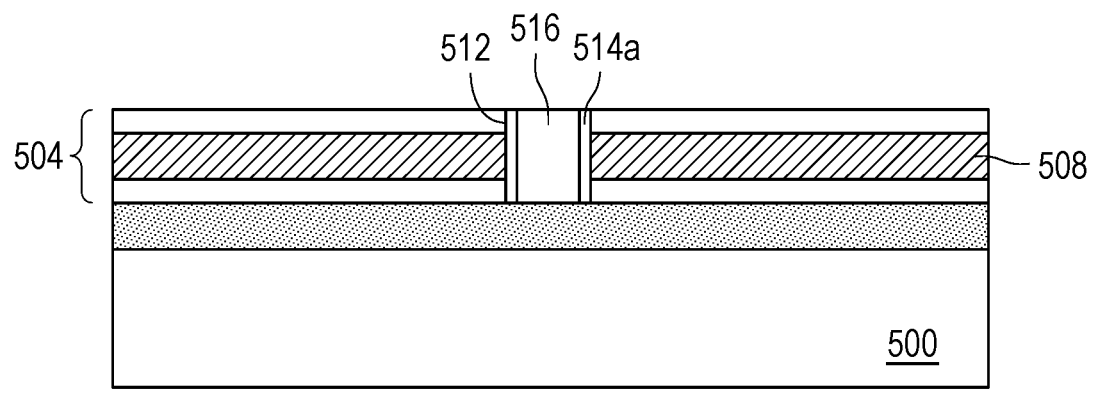

Then, referring to FIG. 5E, an oxide semiconductor layer 516 is formed in the opening 512, wherein the gate dielectric layer 514a is sandwiched between the oxide semiconductor layer 516 and the gate electrode layer 508. In one embodiment, the step of forming the oxide semiconductor layer 516 in the opening 512 includes blanket depositing an oxide semiconductor material (not shown) to fill the opening 516, and then etching back the oxide semiconductor material until the stack structure 504 is exposed. In another embodiment, a method of forming the oxide semiconductor layer 516 in the opening 512 includes a selective deposition process. A material of the oxide semiconductor layer 516 includes, for example, IGZO or other suitable oxide semiconductor material.

Figure 5F:
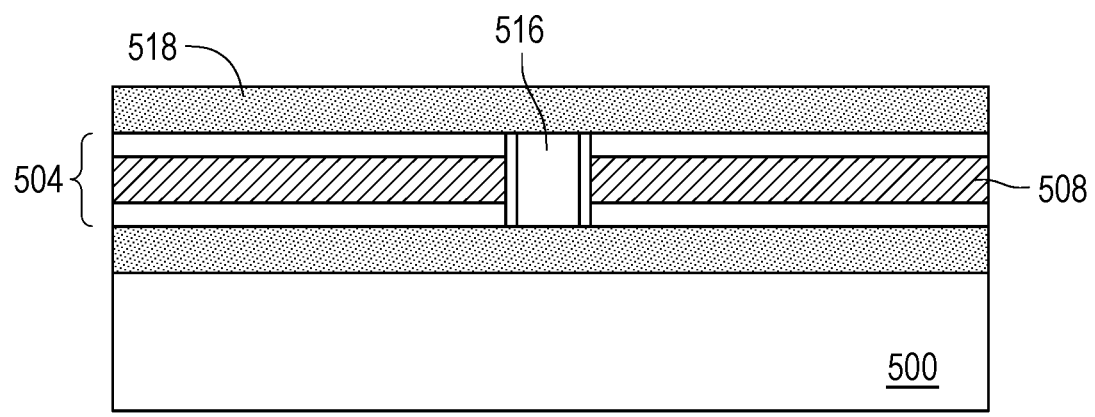

Thereafter, referring to FIG. 5F, a second electrode layer 518 is formed on the stack structure 504 to be in direct contact with the oxide semiconductor layer 516, wherein the method of forming the second electrode layer 518, for example, includes a deposition process. A semiconductor device of the third embodiment has been manufactured in this step.

After the step shown in FIG. 5F, there are some optional steps as follows.

Figure 5G:
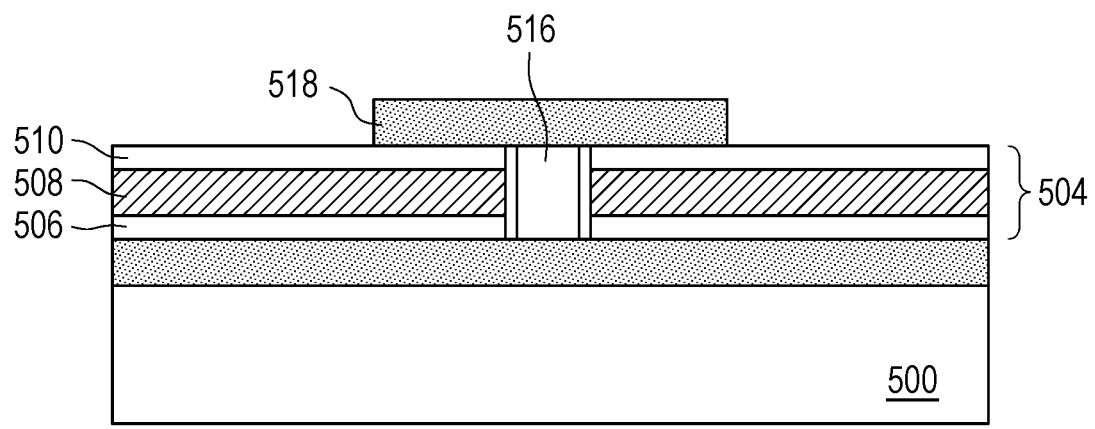

Please referring to FIG. 5G, the second electrode layer 518 is patterned to expose a portion of the stack structure 504.

Figure 5H:
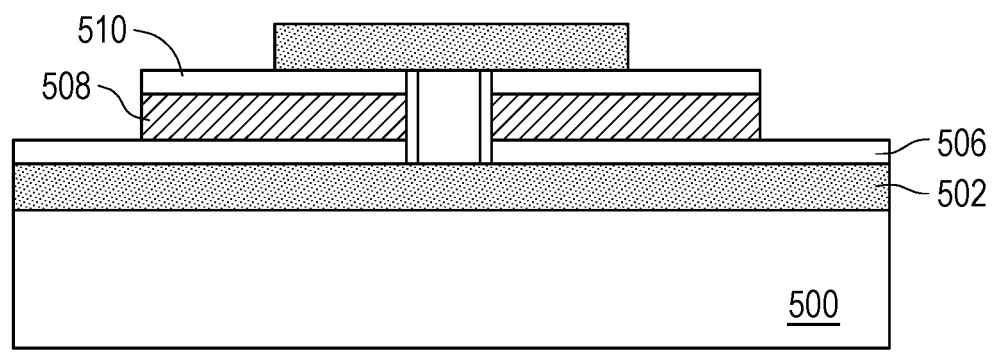

Then, referring to FIG. 5H, the second insulating layer 510 and the gate electrode layer 508 are patterned, and thus the profile of the cross section of the structure in FIG. 5H is step-shaped for the interconnection. In another embodiment, the first insulating layer 506 and the first electrode layer 502 can be further patterned to expose a portion of the substrate 500 (e.g. the semiconductor device as shown in FIG. 4).

Figure 5I:
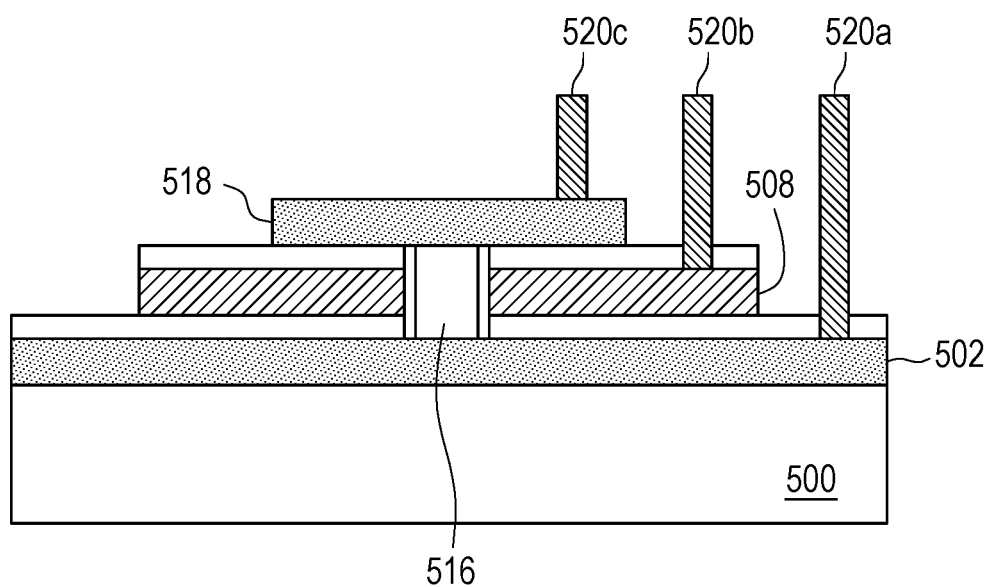

Thereafter, referring to FIG. 5I, electrode contacts 520a, 520b and 520c are formed to connecting to the first electrode layer 502, the gate electrode layer 508, and the second electrode layer 518, respectively.

In summary, the semiconductor device according to the invention comprises a semiconductor device having a planar stack structure containing two source/drain electrodes, a gate electrode layer therebetween, and an oxide semiconductor perpendicularly penetrating through the gate electrode layer, and thus the channel length (Lg) can be defined by the thickness of the gate electrode layer. In other words, according to the invention, fine channel length of the semiconductor device can be accomplished by simple process.

It will be apparent to those skilled in the art that various modifications and variations can be made to the disclosed embodiments without departing from the scope or spirit of the invention. In view of the foregoing, it is intended that the invention covers modifications and variations provided that they fall within the scope of the following claims and their equivalents.

What is claimed is:

1. A semiconductor device, comprising:
a substrate;
a first electrode layer disposed on the substrate;
a gate electrode layer disposed on the first electrode layer, wherein a channel length (Lg) is defined by a thickness of the gate electrode layer;
a second electrode layer disposed on the gate electrode layer, wherein the first electrode layer and the second electrode layer are as a drain and a source of the semiconductor device;
an oxide semiconductor layer penetrating through the gate electrode layer and being in direct contact with the first electrode layer and the second electrode layer respectively;
a gate dielectric layer disposed between the gate electrode layer and the oxide semiconductor layer;
a first insulating layer disposed between the gate electrode layer and the first electrode layer; and
a second insulating layer disposed between the gate electrode layer and the second electrode layer, wherein
a step-shaped structure is composed of the second electrode layer, the second insulating layer, the gate electrode layer, and the first insulating layer,
a bottom surface of the second electrode layer is formed on a top surface of the second insulating layer and a top surface of the gate electrode layer, and
an area of the second electrode layer in a top view is more than an area of the oxide semiconductor layer, and the area of the second electrode layer in the top view is less than an area of the gate electrode layer.

2. The semiconductor device of claim 1, further comprising a plurality of electrode contacts connecting to the first electrode layer, the gate electrode layer, and the second electrode layer respectively.

3. The semiconductor device of claim 1, wherein a material of the oxide semiconductor layer comprises indium-gallium-zinc oxide.

4. The semiconductor device of claim 1, wherein the substrate comprises a silicon-on-insulator (SOI) substrate.

* * * * *